United States Patent
Kumpfmiller et al.

[11] Patent Number: 5,976,765
[45] Date of Patent: Nov. 2, 1999

[54] SOLID-CAPPED LIQUID PHOTOPOLYMER PRINTING ELEMENTS

[75] Inventors: Ronald J. Kumpfmiller, Marietta, Ga.; Martin L. Carter, Greeneville, S.C.; Jung H. Tsao, Marietta, Ga.; William K. Goss, Marietta, Ga.; Michael W. Yang, Marietta, Ga.

[73] Assignee: Polyfibron Technologies, Inc., Atlanta, Ga.

[21] Appl. No.: 09/148,728

[22] Filed: Sep. 4, 1998

[51] Int. Cl.$^6$ ..................................................... G03F 7/00
[52] U.S. Cl. ........................ 430/306; 430/300; 430/15; 430/273.1
[58] Field of Search ................................. 430/300, 306, 430/15, 273.1

[56] References Cited

U.S. PATENT DOCUMENTS

| | | | |
|---|---|---|---|
| 3,990,897 | 11/1976 | Zuerger et al. | 96/67 |
| 4,266,007 | 5/1981 | Hughes et al. | 430/306 |
| 4,332,873 | 6/1982 | Hughes et al. | 430/15 |
| 5,252,428 | 10/1993 | Kawamoto et al. | 430/306 |
| 5,328,805 | 7/1994 | Huynh-Tran et al. | 430/284 |
| 5,362,605 | 11/1994 | Mirle et al. | 430/300 |
| 5,364,741 | 11/1994 | Huynh-Tran et al. | 430/300 |
| 5,554,712 | 9/1996 | Huynh-Tran et al. | 528/58 |
| 5,589,306 | 12/1996 | Takahashi et al. | 430/306 |

OTHER PUBLICATIONS

Standard Test Methods for Rubber Property—Durometer Hardness, American Society For Testing and Materials; Designation: D 2240–91, pp. 1–4.

*Primary Examiner*—Janet Baxter
*Assistant Examiner*—Sin J. Lee
*Attorney, Agent, or Firm*—Woodcock Washburn Kurtz Mackiewicz & Norris LLP

[57] ABSTRACT

Multilayer printing plates having layers with differing moduli are made by exposing through a photographic negative a plurality of layers comprising a solid photocurable cap and al least one liquid photocurable layer.

13 Claims, 1 Drawing Sheet

SOLID-CAPPED LIQUID PHOTOPOLYMER PRINTING ELEMENTS

FIELD OF THE INVENTION

The present invention is directed to composite printing elements having solid and liquid layers and, more particularly, to photosensitive printing elements comprising a solid photopolymerizable cap and at least one liquid photopolymerizable layer. The invention is also directed to methods for making and using the photosensitive printing elements.

BACKGROUND OF THE INVENTION

Relief image printing plates are widely used for printing on a variety of substrates, including paper, corrugated stock, film, foil, and laminates. Relief plates typically include a support layer and one or more layers of cured photopolymer. It is well known in the art that improved print quality results when each layer has a different hardness, i.e., elastic modulus.

Multilayer photopolymer printing plates can be made, for example, by exposing multiple layers of different liquid photopolymerizable compositions to actinic light through a photographic negative, such that, when cured the different layers have different elastic moduli. Multilayer liquid photopolymerizable printing elements, however, have a number of shortcomings. Examples of such shortcomings are tackiness, which causes the substrate or particles of the substrate to adhere to the printing plate, and plate to plate image variation, both of which result in lower print quality.

Consequently, there remains a need in the art for the ability to consistently manufacture tack-free multilayer printing plates from liquid photopolymers.

BRIEF DESCRIPTION OF THE INVENTION

These and other objects are satisfied by the present invention, which provides methods of making multiple layer printing plates from both solid and liquid photopolymerizable materials.

The methods of the invention generally comprise the steps of providing a cap layer of solid photopolymerizable( resin having first and second opposing major faces; placing a photographic negative adjacent to the first major face of the solid layer; placing liquid photopolymer upon the second major face of the layer, thereby defining solid and liquid layers; exposing the layers to actinic light through the photographic negative to polymerize selected portions of the layers; and removing the unpolymerized portions of the solid and liquid layers after the solid and liquid layers have been exposed to actinic light.

In a preferred embodiment of the invention, the solid photopolymer cap is made by uniformly applying a solvated solid photopolymerizable resin, e.g., a polyurethane dissolved in a solvent, onto a cover film and removing the solvent therefrom. The resultant cap is defined by a first major face comprising the cover sheet and a second major face opposing the first major face. The resultant cap is made to contain the cover sheet for placement over the photographic negative, thereby increasing the efficiency of the multilayer liquid photopolymer printing plate manufacturing process by eliminating a process step. Once the cover film-containing cap is placed over a photographic negative, the flexographic printing plate is made according to conventional practices in the multilayer liquid photopolymer printing plate art.

Also, in the preferred embodiment of the invention, the solid photopolymer of the cap layer is selected for its ability to cross-link with the adjacent liquid photopolymerizable resin composition when subjected to actinic radiation, thereby forming an integrated structure. All layers, however, remain distinct entities after the curing process.

BRIEF DESCRIPTION OF THE DRAWINGS

The numerous objects and advantages of the present invention may be better understood by those skilled in the art by reference to the accompanying non-scale figures, in which.

DETAILED DESCRIPTION OF THE INVENTION

Figure 1:
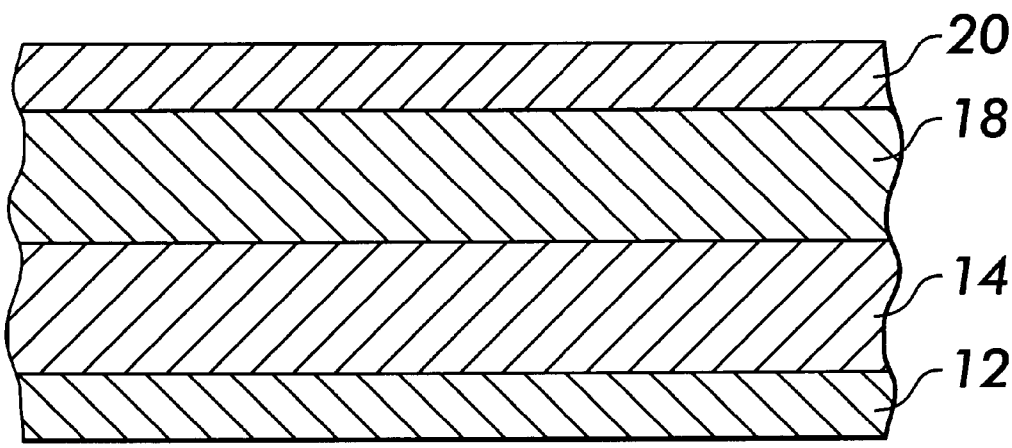
FIG. 1 is a cross-sectional view of a liquid photopolymer flexographic printing element with a solid photopolymer cap according to the invention.

The present inventions involve the incorporation of a solid photopolymer cap into a liquid photocurable printing element (i.e., a photocurable printing plate). Specifically, the inventions relate to a process for making a printing plate from a photocurable element having at least two distinct layers—one of which is a solid—comprising: exposing the photocurable element to actinic light, through a photographic negative. The photocurable elements to be used in accordance with the invention can include one or more liquid layers. In preferred embodiments, the elements vary in thickness from about 0.025 inches to about 0.25 inches and have dimensions up to about 52 inches to about 80 inches. As shown in FIG. 1, a preferred photocurable element 10 comprises a backing sheet 20, at least one liquid photocurable layer 18, a solid photocurable layer 14, defined as the cap, and an optional cover sheet layer 12 for protection of a photographic negative.

According to the method of the invention, a solid photocurable cap is placed over a photographic negative. The solid photocurable cap comprises a solid photopolymerizable resin layer comprising at least one solid photopolymerizable resin and generally has a thickness of from about 0.003 to 0.014 inches. Preferably, the chemical composition of the solid photopolymerizable resin layer is such that the uncured solid polymer is able to be developed, i.e., removed by an aqueous solution comprising a surfactant. Such polymers are generally amine-containing, i.e., polyurethane-(meth)acrylates, and are described in detail in U.S. Pat. Nos. 5,554,712, 5,364,741, and 5,328,805, all to Huynh-Tran et al., the disclosures of which are incorporated herein by reference.

More preferably, polyvinyl pyrrolidone (PVP) is added to the solid photopolymerizable resin (in solution) such that the ratio of solids of PVP to photopolymerizable resin is about 1:1 parts by weight. Even more preferably, the PVP added to the solid photopolymerizable resin has a weight average molecular weight of about 360,000 as determined by gel permeation chromatography and the ratio of solids of PVP to photopolymerizable resin is about 1:1 parts by weight.

The addition of PVP greatly enhances water washability of the uncured solid cap in a water/surfactant solution. Without the addition of PVP to the solid photopolymerizable resin, the resultant plate is alternatively developed in a dilute solution of a weak organic acid, for example, acetic acid or lactic acid.

In a preferred embodiment, the solid photocurable cap includes an optional transparent cover film layer that can be interposed between the cap and a photographic negative. Preferably, the cover film is flexible and formed from polyester. Representative cover films include the FLEX-COVER and FLEXCOVER M products sold by Polyfibron Technologies, Inc., Atlanta, Ga.

Once the cover film-containing cap is placed over an image bearing photographic negative, the flexographic printing plate is made according to conventional practices in the multilayer liquid photopolymer printing plate art. According to these conventional practices, at least one layer of liquid photopolymer is then dispensed over the solid cap at the desired thickness and the backing sheet is placed over the outermost liquid layer (if more than one) to form the element.

More specifically, the liquid photocurable layer, which generally has a thickness of about 0.030 to about 0.250 inches, is chosen for its compatibility with the solid photocurable resin layer such that after the curing process, the liquid and solid layers remain distinct entities yet bond together tightly enough (without the aid of an adhesive) that the layers will not separate or fracture during the printing process.

Suitable liquid photocurable materials include unsaturated polymeric compounds such as polyesters, polyethers, polyene-thiol compositions, polyurethanes, terminally unsaturated homopolymers and copolymers of butadiene, isoprene, chloroprene, styrene, isobutylene, and ethylene in which the terminal unsaturation is attached to the polymer through a combination of at least two ether, thioether, ester, keto, or amide groups, used in combination with a photo-initiator. Exemplary liquid photocurable materials are disclosed in U.S. Pat. No. 3,661,575 (Ketley et al.); U.S. Pat. No. 4,332,873 (Hughes et al.); and U.S. Pat. No. 4,266,007 (Hughes et al.), which are incorporated herein by reference.

If additional liquid photocurable layers are used, for example, to achieve a printing plate with particular hardness characteristics (e.g., to achieve a particular gradient of elastic moduli), such layers are typically disposed upon the first.

The photocurable materials of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions for curing the photocurable materials of the invention are from about: 250 nm to about 450 nm, more preferably from about 300 nm to about 400 nm, even more preferably from about 320 nm to about 380 nm.

Preferably, the chemical composition of the solid photocurable resin layer and the adjacent liquid photocurable layer are same, differing only in average molecular weight. For example, the solid photopolymer comprising the solid photocurable resin cap may be a polyurethane with an average molecular weight of about 5,000 to 60,000 (preferably about 5,000 to 30,000), whereas the liquid photopolymer comprising the liquid photocurable layer 18 may be a polyurethane with an average molecular weight about 1500 or less.

It is also preferable that the solid and liquid photopolymers have the same unsaturated terminal groups such as, for example, a methacrylate, or a diisocyanate for UV curability to ensure a tight bond between the solid and liquid layers 14 and 18, respectively. Suitable terminal groups are described in U.S. Pat. Nos. 5,554,712, 5,364,741, and 5,328,805, all to Huynh-Tran et al.

The hardness of the solid and liquid layers is achieved by adjusting the composition of each layer so that the layers will have the desired relative hardness after curing. This is typically accomplished by those skilled in the art by controlling the amount of cross-linking which occurs during photopolymerization. The amount of cross-linking in a polymer composition is directly proportional to its hardness. Those skilled in the art typically control the amount of cross-linking by choosing or making polymers with different degrees of unsaturation. The more unsaturation within a polymer composition, the more cross-linked the polymer will be once cured and, hence, the harder it will be. This and other methods of achieving different: degrees of hardness and other desired physical and chemical characteristics of cured photopolymer resins comprising relief image flexographic printing plates are well known lo those skilled in the art and are discussed in detail in U.S. Pat. No. 4,332,873 to Hughes et al. and U.S. Pat. No. 3,990,897 to Zuerger et al., and are incorporated herein by reference. Hardness is typically measured according to the procedure set forth in ASTM standard D 2240-91 (Standard Test Method for Rubber Property—Durometer Hardness).

Finally, backing sheet 20 is generally applied as a support. This backing layer can be formed from a transparent or opaque material such as paper, cellulose film, plastic, or metal. In preferred embodiments, it is a polyethylene terephthalate film having a thickness on the order of 0.005 inches. The support optionally bears an adhesive for more secure attachment to the photocurable layer. Typically, an ultraviolet transparent film is used as the backing sheet 20 to make possible a secondary back exposure during development.

Exposure of the element thus formed typically involves back exposure to actinic radiation through the support layers, then front exposure to actinic radiation through the image bearing negative. It is this front exposure that typically creates the relief image as the light hardens the polymer in those areas I which the light can pass through the negative. The plate is then developed by removal of the cover sheet and of the excess (uncured) photopolymer, washing in a surfactant-containing solution, an optionally by an additional exposure to UV light to complete the curing process.

Additional objects, advantages, and novel features of this invention will become apparent to those skilled ill the art upon examination of the following examples thereof, which are not intended to be limiting.

EXAMPLE 1

About 1000 g of a stock solution of Flexlight Splash IIF (Polyfibron Technologies, Inc., Atlanta, Ga.; containing 440 grams (44%) of solid polymer, 420 grams (4:2%) toluene, and 140 grams (14%) methyl ethyl ketone) was modified by the addition of about 360 grams of toluene an(i about 640 grams of methyl ethyl ketone to achieve a final composition consisting of about 22% solid polymer in a 1:1 solution of toluene to methyl ethyl ketone. A 10 mil wet film of the modified solution was coated onto silicone-coated release polyester cover film using a doctor blade to cast a 4 mil dry film.

A sample plate was made from this film by using a Merigraph 100 type exposure unit. The cover film-containing solid cap was placed over an image bearing negative. Then Letterflex 32C (Polyfibron Technologies, Inc., Atlanta, Ga.) polymer base was applied on top of the solid cap. A piece of Flexback (Polyfibron Technologies, Inc., Atlanta, Ga.) substrate was positioned over the 32C base and the total plate composition was compressed to 110 mil. The plate was first given a 1.6 minute back exposure through the polyester Flexback substrate, followed by an 8 minute face exposure through the negative and solid cap. The plate was washed for 10 minutes in a 35 gallon rotary wash out unit. The wash up solution used contained 0.75 gallon of Flexowash X-100 (Polyfibron Technologies, Inc., Atlanta, Ga.) and one-half pint silicon defoamer. The plate was dried and post-exposed for 10 minutes. The resulting plate did not wash away in the plate areas with fine reverses.

EXAMPLE 2

About 2.2 grams of 360,000 molecular weight polyvinyl pyrrolidone (PVP) was added to about 10 grams of the modified stock solution of Flexlight Splash IIF of Example 1 such that the solids in the solution comprised 1 part PVP and 1 part Splash IIF. A 10 mil wet film was coated onto silicone-coated release polyester cover film using a doctor blade to cast a 4 mil dry film.

A sample plate was made using this film by using a Merigraph 100 type exposure unit. The cover film-containing solid cap was placed over an image bearing negative. Then Letterflex 32C polymer base was applied on top of the solid cap. A piece of Flexback substrate was positioned over the 32C base and the total plate composition was compressed to 110 mil with a 110 mil shim stock (the dimensions of the shim stock are 0.110"×0.5"×18"). The plate was given a 1.6 minute back exposure through the polyester Flexback substrate, followed by an 8 minute face exposure through the negative and solid cap. The plate was then washed for 10 minutes in a 35 gallon rotary wash out unit. The wash up solution used contained 0.75 gallon of Flexowash X-100 and one-half pint silicon defoamer. The plate was dried and post-exposed for 10 minutes.

The cap according to this example achieved development (wash out) in the fine reverse areas, was tack free, and showed crazing when the plate was folded onto itself.

EXAMPLE 3

About 1.6 grams of Letterflex XLF230 Red (Polyfibron Technologies, Inc., Atlanta, Ga.) was added to about 10 grams of a solution consisting of about 1.6 grams of 360,000 molecular weight polyvinyl pyrrolidone (PVP) dissolved in about 8.4 grams of isopropyl alcohol such that the solids in the solution comprised 1 part PVP and 1 part XLF230 Red. A 10 mil wet film was coated onto silicone-coated release polyester cover film using a doctor blade to cast a 4 mil dry film. The resulting film dried solid and milky white. The film dissolved in water and also in a Flexowash 100 bath.

EXAMPLE 4

About 3.2 grams of Letterflex XLF230 Red was added to about 1.6 grams of a solution consisting of about 1.6 grams of 360,000 molecular weight polyvinyl pyrrolidone (PVP) dissolved in about 8.4 grams of isopropyl alcohol such that the solids in the solution comprised 0.5 part PVP and 1 part XLF230 Red. A 10 mil wet film was coated onto silicone-coated release polyester cover film using a doctor blade to cast a 4 mil dry film. The resulting film dried tacky yet clearer than example 3. The film dissolved in water and also in a Flexowash 100 bath.

EXAMPLE 5

About 2.2 grams of Letterflex XLF230 Red was added to about 10.0 grams of the modified stock solution of Flexlight Splash IIF of Example 1 such that the solids in the solution comprised of 1 part Splash IIF and 1 part XLF230 Red. A 10 mil wet film was coated onto silicone-coated release polyester cover film using a doctor blade to cast a 4 mil dry film. The resulting film dried very tacky and clear.

EXAMPLE 6

About 11.0 grams of Letterflex XLF230 Red was added to about 100.0 grams of the modified stock solution of Flexlight Splash IIF of Example 1 such that the solids in the solution comprised 1 part Splash IIF and 0.5 part XLF230 Red. A 10 mil wet film was coated onto silicone-coated release polyester cover film using a doctor blade to cast a 4 mil dry film. The resulting film dried tacky and slightly hazy.

EXAMPLE 7

To about 2.8 grams of Letterflex XLF230 Red (Polyfibron Technologies, Inc., Atlanta, Ga.), about 10.0 grams of Diaformer ZSM (Sandoz) at 28% solids was added such that the solids in the solution comprised 1 part Diaformer ZSM and 1 part XLF230 Red. A 10 mil wet film was coated onto silicone-coated release polyester cover film using a doctor blade to cast a 4 mil dry film. The resulting film dried lumpy, very brittle and was not soluble or dispersible in the surfactant solution.

EXAMPLE 8

About 5.5 grams of Letterflex XLF230 Red was added to about 100.0 grams of the modified stock solution of Flexlight Splash IIF of Example 1 such that the solids in the solution comprised 1 part Splash IIF and 0.25 part XLF230 Red. A 10 mil wet film was coated on to silicone-coated release polyester cover film using a doctor blade to cast a 4 mil dry film. The resulting film dried less tacky then example 6 and slightly hazy. This sample was water dispersible.

EXAMPLE 9

To about 1.6 grams of a stock solution of Letterflex Newspress RSA (Polyfibron Technologies, Inc., Atlanta, Ga.), about 10 grams of a solution consisting of 1.6 grams of 360,000 molecular weight polyvinyl pyrrolidone (PVP) dissolved in about 8.4 grams of isopropyl alcohol was added such that the solids in the solution comprised 1 part PVP and 1 part Newspress RSA. A 10 mil wet film was coated onto silicone-coated release polyester cover film using a doctor blade to cast a 4 mil dry film. The resulting film is dry non-tacky, clear and brittle. The film dissolves in water and also in a Flexowash 100 bath.

EXAMPLE 10

To about 10 grams of a stock solution of Letterflex Newspress RSA about 1.0 gram of Ethyl Cellulose was added such that the solids in the solution comprised 1 part Ethyl cellulose and 4 parts Newspress RSA. A 10 mil wet film was coated onto silicone-coated release polyester cover film using a doctor blade to cast a 4 mil dry film. The resulting film was dry, non-tacky, clear and pliable. The film did not dissolve in water or in a Flexowash 100 bath.

EXAMPLE 11

Mixing 1 part by weight of Example 9 to 1 part of example 10. A 10 nil wet film was coated onto silicone-coated release polyester cover film using a doctor blade to cast a 4 mil dry film. The resulting film was dry, non-tacky, clear and pliable. The film dissolved in water and in a Flexowash 100 bath.

EXAMPLE 12

About 22 grams of 10,000 molecular weight polyvinyl pyrrolidone (PVP) was added to about 100 grams of the modified stock solution of Flexlight Splash IIF of Example 1 such that the solids in the solution comprised 1 part PVP and 1 part Splash IIF. A 10 mil wet film was coated on to silicone-coated release polyester cover film using a doctor blade to cast a 4 mil dry film.

A sample plate was made using this film by typical liquid plate technique using a Merigraph 100 type exposure unit. The cover film with the solid cap was placed over an image bearing negative. Then Letterflex 32C (Polyfibron Technologies, Inc., Atlanta, Ga.) polymer base was applied on top of the solid cap. A piece of Flexback substrate was positioned over the 32C base and the total plate composition was compressed to 110 mil with a 110 mil shim stock (the dimensions of the shim stock are 0.1101"×0.511×18"). The plate was given a 1.6 minute back exposure through the polyester Flexback substrate, followed by an 8 minute face exposure through the negative and solid cap. The plate was then washed for about 10 minutes in a 35 gallon rotary wash out unit. The wash up solution used contained 0.75 gallon of Flexowash X-100 and one-half pint silicon defoamer. The plate is dried and post-exposed for 10 minutes.

The cap made according to this example did not achieve development (wash out) in the fine reverse areas. The plate, however, was tack free and did not show crazing when folded onto itself.

EXAMPLE 13

About 22 grams of 40,000 molecular weight polyvinyl pyrrolidone (PVP) was added to about 100 grams of the modified stock solution of Flexlight Splash IIF of Example 1 such that the solids in the solution comprised 1 part PVP and 1 part Splash IIF. A 10 mil wet film was coated onto silicone-coated release polyester cover film using a doctor blade to cast a 4 mil dry film.

A sample plate was made using this film by typical liquid plate technique using a Merigraph 100 type exposure unit. The cover film with the solid cap was placed over an image bearing negative. The Letterflex 32C polymer base was then applied on top of the solid cap. A piece of Flexback substrate was positioned over the 32C base and the total plate composition was compressed to 110 mil. The plate was given a 1.6 minute back exposure through the polyester Flexback substrate, followed by an 8 minute face exposure through the negative and solid cap. The plate was then washed for 10 minutes in a 35 gallon rotary wash out unit. The wash up solution used contained 0.75 gallons of Flexowash X-100 and one-half pint silicon defoamer. The plate was dried and post-exposed for 10 minutes.

The cap made according to this example did not achieve development (wash out) in the fine reverse areas. The plate, however, was tack free and did not show crazing when folded onto itself.

EXAMPLE 14

About 22 grams of KLUCEL L (Hercules, Inc., Wilmington, Del.) hydroxypropylcellulose was added to about, 100 grams of the modified stock solution of Flexlight Splash IIF of Example 1 such that the solids in the solution comprised of 1 part KLUCEL L and 1 part Splash IIF. A 10 mil wet film was coated onto silicone-coated release polyester cover film using a doctor blade to cast a 4 mil dry film.

A sample plate was made using this film by typical liquid plate technique using a Merigraph 100 type exposure unit. The cover film with the solid cap was placed over an image bearing negative. Then Letterflex 32C polymer base was applied on top of the solid cap. A piece of Flexback substrate was positioned over the 32C base and the total plate composition was compressed to 110 mil with a 110 mil shim stock (the dimensions of the shim stock are 0.110"×0.5"× 18"). The plate was given a 1.6 minute back exposure through the polyester Flexback substrate, followed by an 8 minute face exposure through the negative and solid cap. The plate was then washed for about 10 minutes in a 35 gallon rotary wash out unit. The wash up solution used contained 0.75 gallons of Flexowash X-100 and one-half pint silicon defoamer. The plate was dried and post-exposed for 10 minutes. This example cap did not achieve development (wash out) in the fine reverse areas. The plate, however, was tack free and a texture was seen in the cap. The plate did show crazing when folded onto itself.

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A method of making a photopolymeric printing element comprising the steps of:
   providing a cap which comprises a layer of solid photocurable resin having first and second opposing major faces;
   placing a photographic negative adjacent said first face of said solid layer;
   providing a liquid photopolymer adjacent said second face of said layer, thereby forming a multilayer composite; and
   exposing said composite to actinic light through the photographic negative for a time and under conditions effective to polymerize selected portions of the composite.

2. The method according to claim 1 further comprising the step of removing unpolymerized portions of said composite after said exposing step.

3. The method according to claim 1 wherein said cap is formed by:
   providing a layer of solvated solid photocurable resin on a cover film; and
   removing the solvent, thereby forming said cap.

4. The method according to claim 1 wherein said cap comprises a solid photocurable resin layer and a cover film layer adjacent said first face of said resin layer.

5. The method according to claim 4 wherein said solid photocurable resin layer comprises polyvinyl pyrrolidone.

6. The method according to claim 5 wherein said polyvinyl pyrrolidone has a weight average molecular weight of about 360,000.

7. The method according to claim 4 wherein said solid photocurable resin layer comprises polyvinyl pyrrolidone and a solid photocurable resin in a ratio of about 1:1 by weight.

8. The method according to claim 4 wherein said solid photocurable resin layer comprises a polyurethane.

9. The method according to claim 8, wherein said polyurethane has a weight average molecular weight of about 360,000.

10. The method according to claim 1 wherein said solid photocurable resin is soluble in an aqueous medium.

11. The method according to claim 10 wherein said aqueous medium contains a surfactant.

12. An element comprising:

a cap which comprises a solid photocurable resin and has first and second opposing major faces;

a first liquid photopolymer layer adjacent said first face of said cap; and a cover sheet adjacent said second face of said cap.

13. The printing element according to claim 12 comprising a second liquid photopolymer layer adjacent to said first liquid photopolymer layer.

* * * * *